United States Patent [19]
Kondo et al.

[11] Patent Number: 5,306,933
[45] Date of Patent: Apr. 26, 1994

[54] CCD DELAY LINE WITH SELECTIVE DELAY PERIOD CIRCUIT

[75] Inventors: Tetsuya Kondo; Maki Sato, both of Kanagawa, Japan

[73] Assignee: Sony Corporation, Tokyo, Japan

[21] Appl. No.: 112,531

[22] Filed: Aug. 27, 1993

[30] Foreign Application Priority Data

Aug. 27, 1992 [JP] Japan .................. 4-253884

[51] Int. Cl.⁵ ............................. H01L 29/78
[52] U.S. Cl. ...................... 257/241; 257/240; 377/60; 377/62; 348/250; 348/304; 348/311
[58] Field of Search .............. 358/213.11, 213.22, 358/213.23, 213.25, 213.31; 257/240, 241; 377/60, 61, 62

[56] References Cited

U.S. PATENT DOCUMENTS

| | | | |
|---|---|---|---|
| 4,199,691 | 4/1980 | Angle | 257/241 |
| 4,387,389 | 6/1983 | Tanigawa | 257/241 |
| 4,443,774 | 4/1984 | Lüder et al. | 257/241 |

Primary Examiner—Ngan Ngo
Attorney, Agent, or Firm—Hill, Steadman & Simpson

[57] ABSTRACT

A charge transfer device includes a first input stage converting a first input signal into first signal charge, a first shift register transferring the first signal charge with a first delay amount, a second input stage converting a second input signal into second signal charge and having a first switch for selectively inputting the second signal charge to a second shift register, a third input stage converting a third input signal into third signal charge and having a second switch for selectively inputting the third signal charge to a third shift register, and an adding section for selectively adding one of the second and third signal charge to the first signal charge. The second shift register transfers the second signal charge with a second delay amount and the third shift register transfers the third signal charge with a third delay amount.

12 Claims, 6 Drawing Sheets

CCD DELAY LINE WITH SELECTIVE DELAY PERIOD CIRCUIT

BACKGROUND OF THE INVENTION

1. Field of the Invention

The present invention generally relates to charge transfer devices and, more particularly, is directed to a charge transfer device suitable for use in a charge-coupled device (CCD) delay line having a comb filter characteristic.

2. Description of the Prior Art

A video signal processing system uses a comb filter to to separate a chrominance signal (carrier chrominance signal) from a composite video signal.

From a principle standpoint, the comb filter delays a composite video signal of the NTSC system by one horizontal scanning period (1H) and then subtracts the delayed composite video signal and a succeeding 1H-delayed composite video signal from each other to thereby separate the chrominance signal from the composite video signal. In the case of the PAL video signal, a chrominance signal is separated from a composite video signal by delaying the composite video signal by two horizontal scanning periods.

The comb filter having the aforementioned function can be realized by using a CCD delay line. The conventional comb filter with the aforementioned function can change its characteristic, for example, selectively change its characteristic between a comb filter characteristic with an 1H-delay amount and a comb filter characteristic with a 2H-delay amount in a manner that two CCD delay line respectively used as comb filters with the 1H- and 2H-delay amounts are contained in an integrated circuit (IC) and one of outputs of the two CCD delay line is selectively output.

An example of this type of the conventional comb filter will be described with reference to FIG. 1. Referring to FIG. 1 of the accompanying drawings, video signals INA and INB for obtaining the comb filter characteristic are input to each of two shift register sections 31 and 32 each constituted by a CCD and respectively serving as the comb filters with 1H- and 2H-delay amounts.

In the CCD register sections 31 and 32, for example, in the CCD register section 31, the video signal INA is converted into electric charge (i.e., so-called signal charge) and then delayed by an amount D and the video signal INB is converted into signal charge and then delayed by an amount (1H+D), and both the signal charge with the delay amount D and the signal charge with the delay amount (1H+D) are added, thereby the comb filter characteristic with an 1H-delay amount is obtained.

In general, in order to separate the chrominance signal from the composite video signal in the form of the NTSC system, the video signals with opposite phases shown in FIGS. 2A and 2B are input to the CCD register section 31 as the video signals INA and INB, respectively.

Accordingly, an adding operation is performed in the form of signal charge between the image signal INA and the image signal INB which has a phase opposite to that of the image signal INA and is delayed by 1H with respect to the image signal INA. As a consequence, only the chrominance signal is obtained from the output of the CCD register section 31 as shown in FIG. 2C, so that the separation of the chrominance signal can be realized. One of the outputs of the CCD register sections 31 and 32 is selectively applied to an output circuit 33 through a selection switch SW1 and then output from the output circuit 33 as an output signal. In this case, the changing operation of the switch SW1 is performed in accordance with a control signal applied thereto.

According to the aforementioned prior art technique, however, the changing operation between the comb filter characteristic with an 1H-delay amount and the comb filter characteristic with a 2H-delay amount is performed at the output sides of the CCD register sections. In this regard, since different signals are developed at the outputs of the CCD register sections 31 and 32 simultaneously, a crosstalk occurs between both the outputs, so that an accurate comb filter characteristic may not be obtained due to the crosstalk.

The crosstalk may be eliminated by modifying a layout of a circuit pattern from the CCD register sections to the switch SW1 or modifying the construction of the switch SW1 or the like, which, however, results in the increase of a size of the IC chip.

OBJECTS AND SUMMARY OF THE INVENTION

Therefore, it is an object of the present invention to provide an improved charge transfer device in which the aforementioned shortcomings and disadvantages encountered with the prior art can be eliminated.

More specifically, it is an object of the present invention to provide a charge transfer device which can avoid the crosstalk between the output signals of the CCD register sections and miniaturize a size of the IC chip.

As an aspect of the present invention, there is provided a charge transfer device which includes a first input stage converting a first input signal into first signal charge, a first shift register transferring the first signal charge with a first delay amount, a second input stage converting a second input signal into second signal charge and having a first switch for selectively inputting the second signal charge to a second shift register, the second shift register transferring the second signal charge with a second delay amount, a third input stage converting a third input signal into third signal charge and having a second switch for selectively inputting the third signal charge to a third shift register, the third shift register transferring the third signal charge with a third delay amount, and an adding section for selectively adding one of the second signal charge and the third signal charge to the first signal charge.

As another aspect of the present invention, there is provided a charge transfer device which includes a first input stage converting a first input signal into first signal charge, a first shift register transferring the first signal charge with a first delay amount, a second input stage having a first input source and converting a second input signal into second signal charge according to a voltage of the second input signal, the first input source having a variable potential to selectively input the second signal charge to a second shift register, the second shift register transferring the second signal charge with a second delay amount, a third input stage having a second input source and converting a third input signal into third signal charge according to a voltage of the third input signal, the second input source having a variable potential to selectively input the third signal charge to a third shift register; the third shift register transferring the third signal charge with a third delay amount, and an adding section for selectively adding one of the second signal charge and the third signal charge to the first signal charge.

According to the thus constituted charge transfer device, an input video signal is converted into signal charge by the first shift register (first CCD register section) with a delay amount D and transferred therein, and further a signal having a phase opposite to that of the input video signal is converted into signal charge by the second shift register (second CCD register section) with a delay amount (2H+D) or the third shift register (third CCD register section) with a delay amount (1H+D) and transferred therein, and then these signal charge is added to thereby obtain a comb filter characteristic with an 1H- or 2H-delay amount.

Further, input sources of the second and third shift registers have variable potentials, and the signal charge is selectively input to the second and third shift registers from the input sources thereof by controlling the potentials of the input sources of the second and third shift registers, respectively. That is, the second and third shift registers are selectively made effective in accordance with the potentials of the input sources of the second and third shift registers, respectively.

Furthermore, since the third shift register with a delay amount (1H+D) is connected to a section of the second shift register with a delay amount (2H+D), the shift register with an 1H-delay amount can be shared between the second and third shift registers, thereby a size of the pattern of the IC chip can be miniaturized.

Furthermore, since the potentials of the input sources of the second and third shift registers are controlled so that the comb filter characteristic is changed between one with an 1H-delay amount and one with a 2H-delay amount at the input stages of the signal charges, occurrence of crosstalk can be prevented between the output signals of the shift registers. As a result, degree of freedom as to the pattern layout of the charge transfer device can be improved and so a size of the IC chip can be miniaturized.

The above and other objects, features, and advantages of the present invention will become apparent from the following detailed description of an illustrative embodiment thereof when read in conjunction with the accompanying drawings, in which like reference numerals are used to identify the same or similar parts in the several views.

DETAILED DESCRIPTION OF THE PREFERRED EMBODIMENT

A charge transfer device according to an embodiment of the present invention will now be described with reference to FIGS. 3 to 6.

Figure 1:
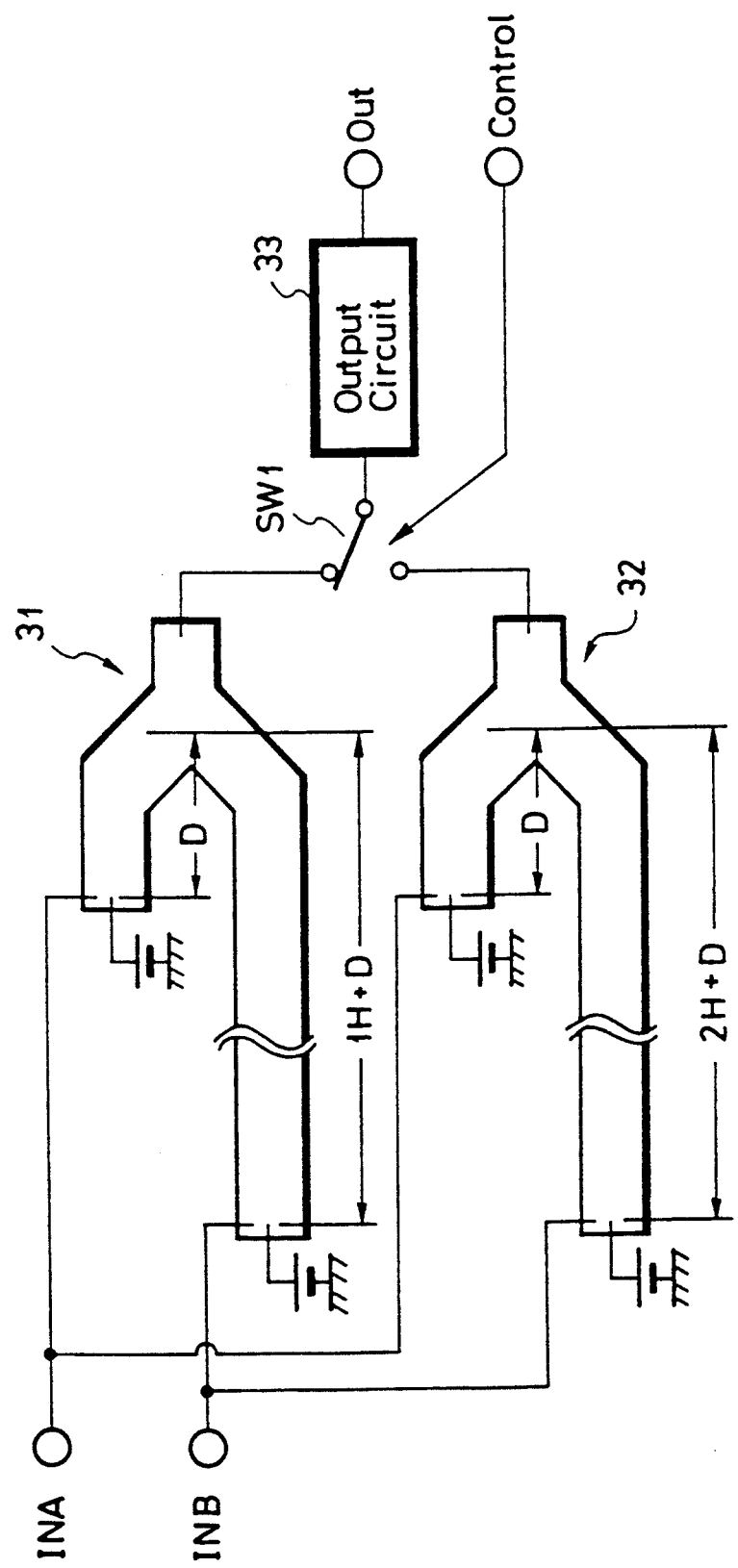
FIG. 1 is a schematic diagram illustrating a structure of a conventional charge transfer device.
Figure 2A:
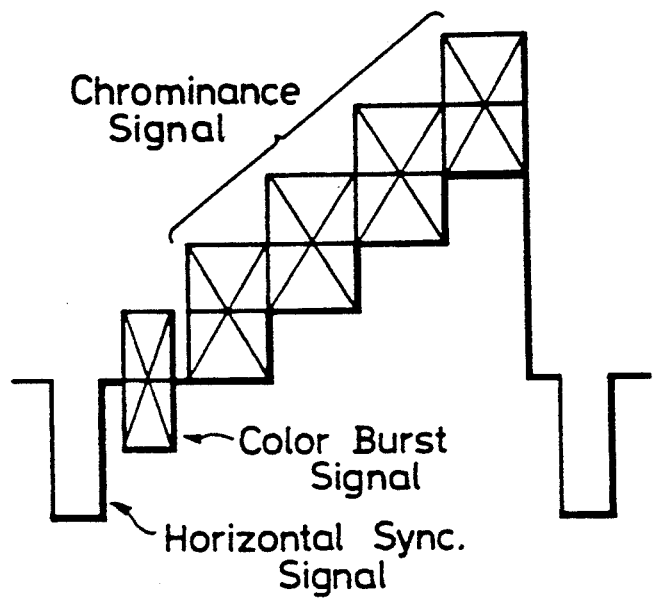
FIGS. 2A to 2C are respectively schematic diagrams illustrating waveforms of a composite video signal and a chrominance signal.
Figure 2B:
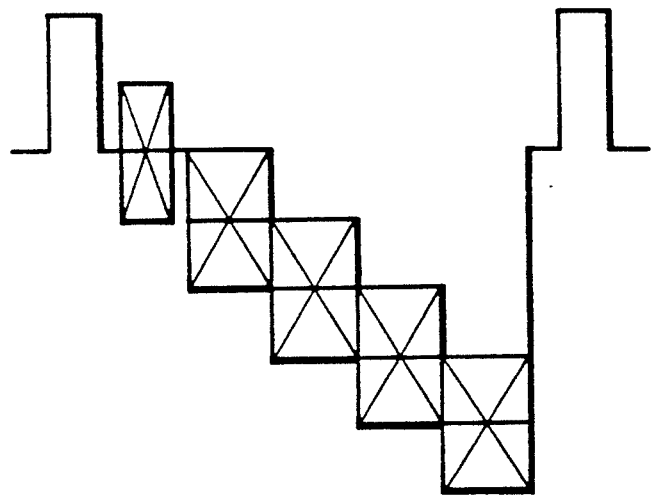
Figure 2C:
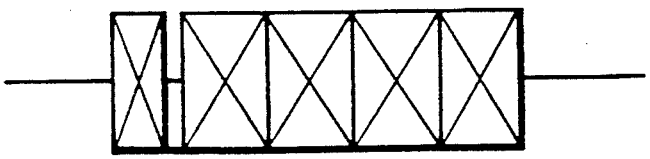
Figure 3:
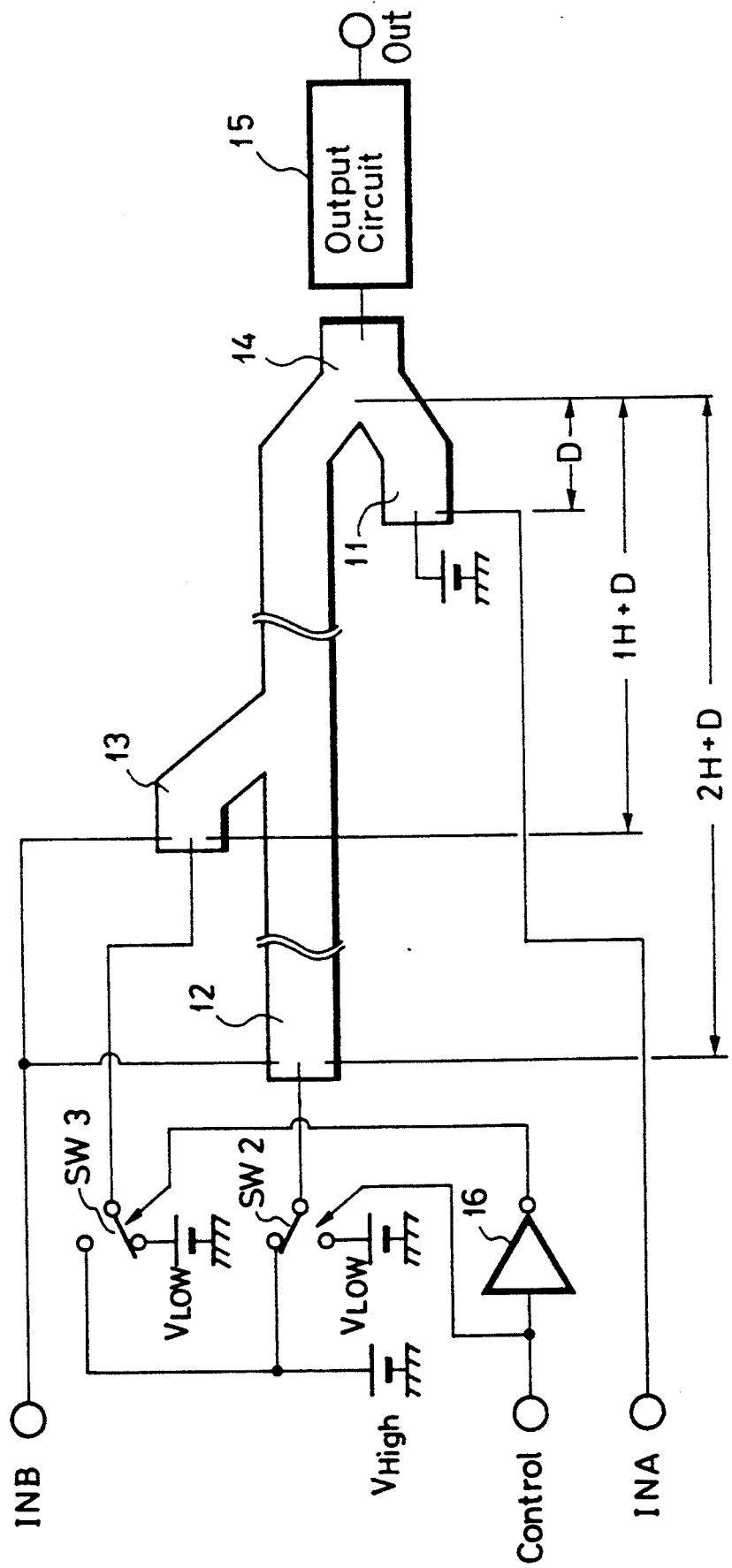
FIG. 3 is a schematic diagram illustrating a structure of a charge transfer device according to an embodiment of the present invention.

FIG. 3 shows a structure of a charge transfer device according to an embodiment of the present invention. Referring to FIG. 3, an input video signal INA is applied to a gate (not shown) of an input section (input stage) of a first shift register section (transfer section) 11 constituted by a CCD. The first CCD register section 11 includes transfer stages whose number corresponds to a delay amount D thereof. The input video signal INA is converted into electric charge (called signal charge or charge packets) corresponding thereto beneath the gate of the input stage and then the signal charge is sequentially transferred to an output stage of the first CCD register section 11.

An input video signal INB having a phase opposite to that of the input video signal INA is applied to a gate (not shown) of an input stage of a second shift register section 12 constituted by a CCD. The second CCD register section 12 includes transfer stages whose number corresponds to a delay amount (2H+D) thereof when the SW2 is connected to $V_{Low}$. The input video signal INB is converted into a signal charge beneath the gate of the input stage of the second CCD register section 12 and then the signal charge is sequentially transferred to an output stage of the second CCD register section 12.

A third shift register section 13 constituted by a CCD is coupled to a portion of the second CCD register section 12. The video signal INB is also applied to a gate (not shown) of an input stage of the third CCD register section 13. The third CCD register section 13 includes transfer stages whose number corresponds to a delay amount (1H+D) thereof from the gate thereof to the output stage of the second CCD register section 12 when the SW3 is connected to $V_{Low}$. The input video signal INB is converted into a signal charge beneath the gate of the input stage of the third CCD register section 13 and then the signal charge is sequentially transferred to the output stage of the second CCD register section 12.

In each of the CCD register sections 11 to 13, a delay time (delay amount) D is given by the following basic calculation model:

$$\text{model model } D = N \times 1/fc \quad \ldots (1)$$

where N is the number of transfer stages and fc is the sampling frequency.

The signal charge transferred by the first CCD register section 11 and the signal charge transferred by the second CCD register section 12 or the third CCD register section 13 is added or accumulated by an adding or accumulating section 14, whereby a comb filter characteristic with 1H- or 2H-delay amount can be obtained. The signal passed through the comb filter with the 1H- or 2H-delay amount is output externally through an output circuit 15.

Figure 4:
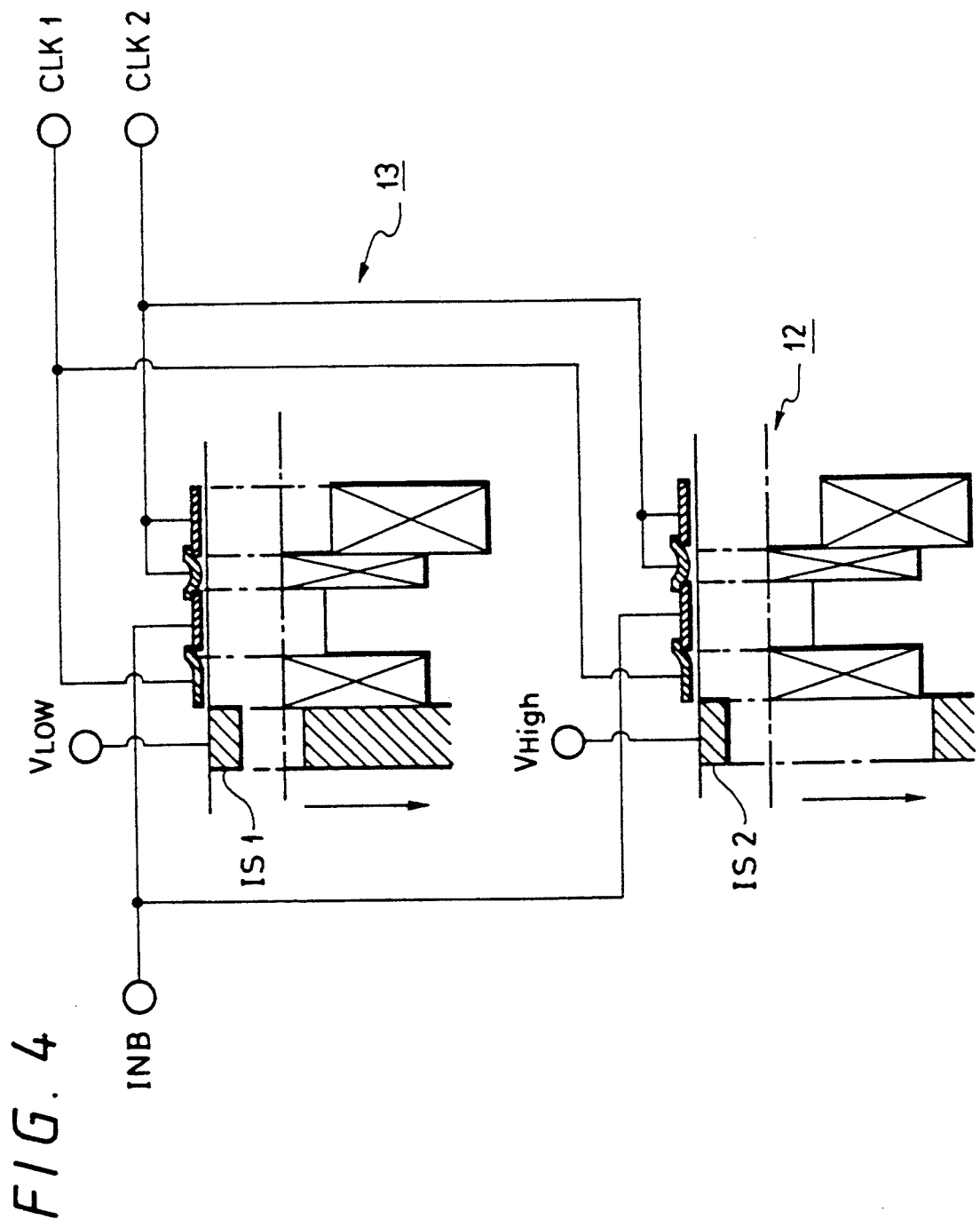
FIG. 4 is a schematic diagram illustrating electric potentials of input stages of CCD register sections with 1H- and 2H-delay amounts.

FIG. 4 shows an electric potential of the input stages of the second and third CCD register sections. Referring to FIG. 4, input sources IS2 and IS1 of the second and third CCD register sections 12 and 13 are selectively applied with a high voltage $V_{High}$ or a low voltage $V_{Low}$ through selection switches SW2 and SW3, respectively.

The switch SW2 is controlled so as to selectively connect the second CCD register section 12 to one of power sources of the high and low voltages $V_{High}$ and $V_{Low}$ in response to a control signal supplied from an external circuit, and the switch SW3 is also controlled so as to selectively connect the third CCD register section 13 to one of the power sources of the high and low voltages in response to a signal which is obtained by inverting the control signal through an inverter 16. Accordingly, when the low voltage $V_{Low}$ is applied to the input source IS2 of the second CCD register section 12, the high voltage $V_{High}$ is applied to the input source IS1 of the third CCD register section 13. On the other hand, when the high voltage $V_{High}$ is applied to the input source IS2 of the second CCD register section 12, the low voltage $V_{Low}$ is applied to the input source IS1 of the third CCD register section 13.

Figure 5:
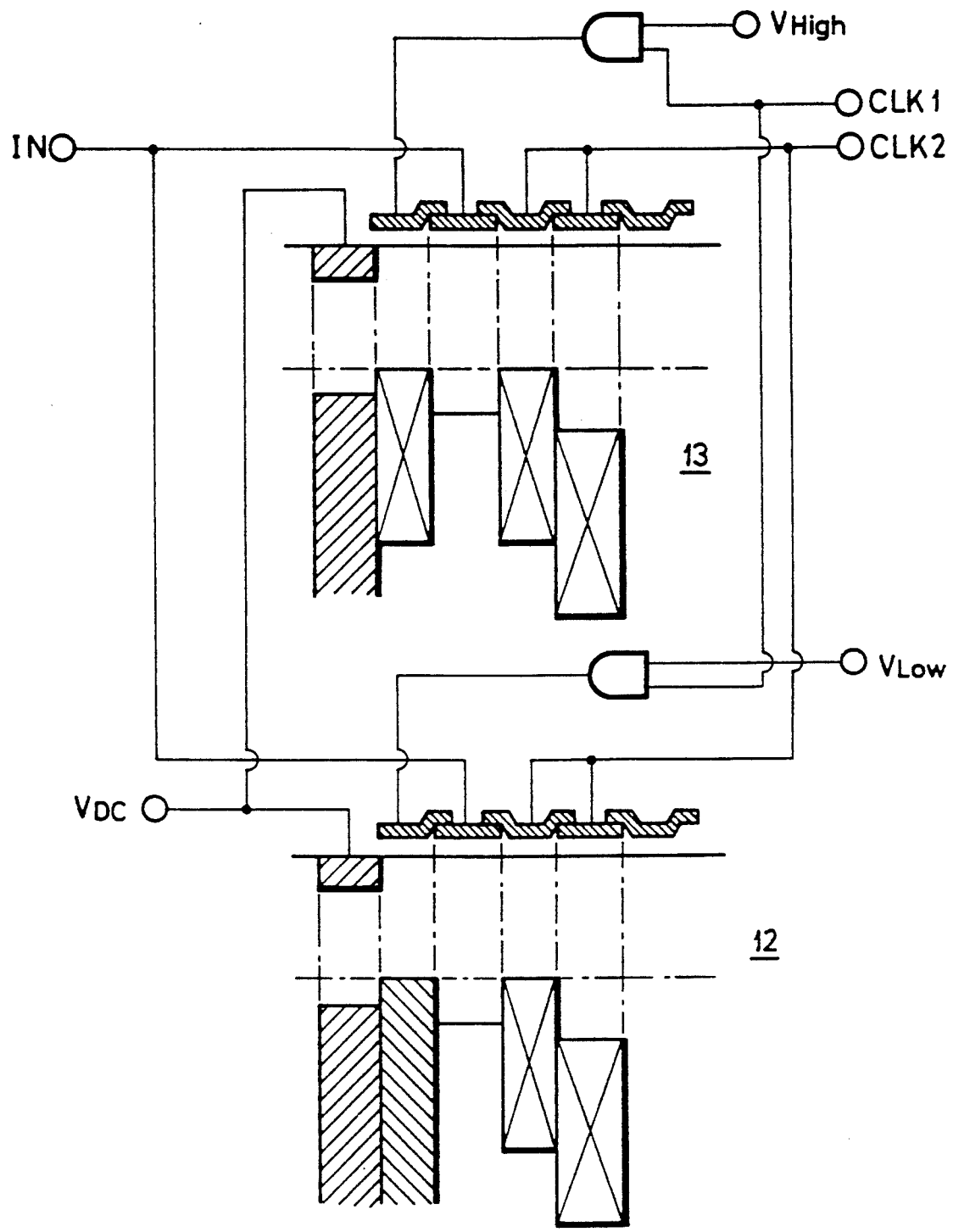
FIG. 5 is a schematic diagram illustrating an example of switching sections of the input stages of the CCD register sections with 1H- and 2H-delay amounts.

FIG. 5 shows an example of switching sections of the input stages of the second and third CCD register sections 12 and 13. Referring to FIG. 5, when a high voltage is applied to a switching section of the input stage of the third CCD register section 13, the switching section thereof is selected. In this case, a low voltage is applied to a switching section of the input stage of the second CCD register section 12, so that the switching section thereof is not selected. That is, when the high voltage is applied to the switching section of the input stage, a potential or potential level beneath the switching section changes high and low, that is, a potential well beneath the switching sections changes shallow and deep in accordance with a transfer clock, so that the signal charge is transferred to the sift register section in accordance with a voltage of the input signal. In contrast, when the low voltage is applied to the switching section of the input stage, a potential level beneath the switching section is kept low irrespective of the transfer clock CLK1, so that the signal charge is not transferred to the shift register section.

Figure 6:
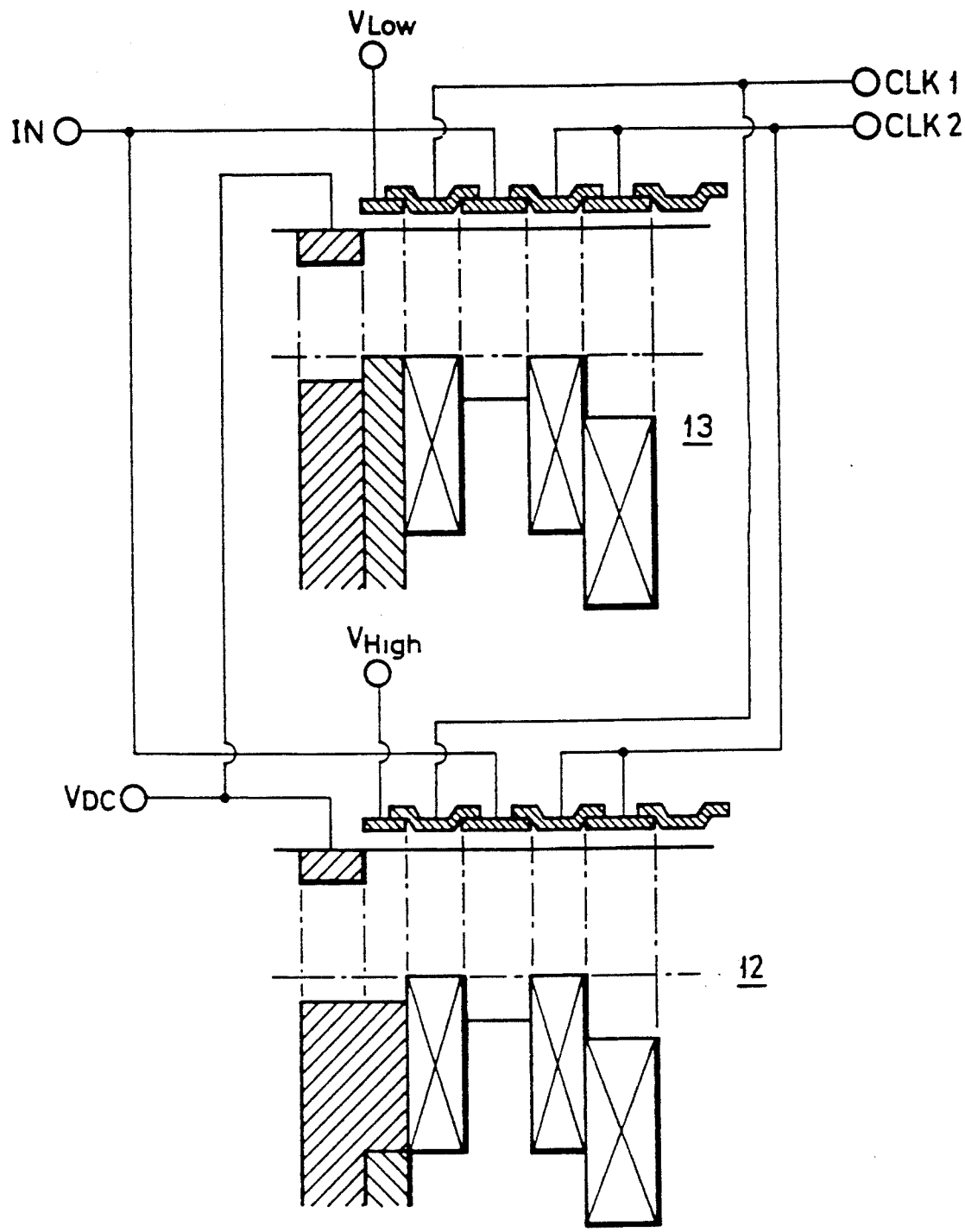
FIG. 6 is a schematic diagram illustrating another example of the switching sections of the input stages of the CCD register sections with 1H- and 2H-delay amounts.

FIG. 6 shows another example of the switching sections of the input stages of the second and third CCD register sections 12 and 13. Referring to FIG. 6, when a low voltage is applied to the switching section of the input stage of the third CCD register section 13, the switching section thereof is not selected. In this case, a high voltage is applied to the switching section of the input stage of the second CCD register section 12, so that the switching section thereof is selected. That is, when the low voltage is applied to the switching section of the input stage, a potential barrier is formed beneath the switching section, so that the signal charge is not transferred to the shift register section. In contrast, when the high voltage is applied to the switching section of the input stage, a potential barrier level is lowered beneath the switching section so that the signal charge is transferred to the shift register section in accordance with a voltage of the input signal.

Operation of the embodiment will be described with also reference to FIGS. 3 and 4. First, the switches SW2 and SW3 are set in a state shown in FIG. 3, for example, so that the voltages of the input sources IS2 and IS1 of the second and third CCD register sections 12 and 13 are set to be the high level $V_{High}$ and the low level $V_{Low}$, respectively.

In this case, as shown in FIG. 4, a potential well at a portion beneath the input source IS1 is shallow (that is, a potential level thereat is low), while a potential well at a portion beneath the input source IS2 is deep (that is, a potential level thereat is high), so that signal charge is not input to the input stage of the second CCD register section 12 from the input source IS2 thereof.

As a consequence, since signal charge is not present at the former half portion, that is, the input side portion of the second CCD register section 12, only the third CCD register section 13 is made effective.

That is, when the video signal INB is applied to the gate of the input stage of the third CCD register section 13, the input video signal INB is converted into signal charge corresponding thereto beneath the gate. Transfer clocks CLK1 and CLK2 with opposite phases are applied to transfer electrodes of the third CCD register sections 13, so that the potential wells of the third CCD register section 13 beneath the transfer electrodes become alternately deep and shallow, whereby the signal charge is transferred to the output stage of the second CCD register section 13. Therefore, only the signal charge with a delay amount (1H+D) is transferred to the adding section 14 from the second and third CCD register sections and then added to a signal charge with a delay amount D transferred from the first CCD register section 11. Consequently, a comb filter characteristic with a delay amount 1H is obtained.

A comb filter characteristic with a delay amount 2H will be obtained in the following manner. That is, states of the switches SW2 and SW3 are made in opposite to that of FIG. 3. As a consequence, the voltages of the input sources IS2 and IS1 of the second and third CCD register sections 12 and 13 are set to be the low level $V_{Low}$ and the high level $V_{High}$, respectively, so that the signal charge from the third CCD register section 13 is not applied to the second CCD register section 12.

As described above, in accordance with the embodiment, the comb filter characteristic is changed between one with an 1H-delay amount and one with a 2H-delay amount at the input stages of the signal charges and the signal charge is not input into the CCD register section which is not used, so that only signal charge required to obtain a required comb filter characteristic is applied to the output circuit 15. As a result, occurrence of crosstalk can be prevented between the output signals of the CCD register sections.

Accordingly, degree of freedom as to the pattern layout such as output wirings of the CCD register sections can be improved and so a size of the IC chip can be miniaturized.

Further, since the shift register with an 1H-delay amount can be shared between the second and third CCD register sections 12 and 13, a size of the pattern of the IC chip can also be miniaturized.

As set out above, according to the present invention, since the potentials of the input sources of the CCD register sections 12 and 13 with delay amounts (2H+D) and (1H+D) are controlled so that the comb filter characteristic is changed between one with an 1H-delay amount and one with a 2H-delay amount at the input stages of the signal charges, occurrence of crosstalk can be prevented between the output signals of the CCD register sections. As a result, degree of freedom as to the pattern layout of the charge transfer device can be improved and so a size of the IC chip can be miniaturized.

Further, since the shift register for a delay amount (1H+D) is connected to a portion of the shift register with a delay amount (2H+D), the shift register with an 1H-delay amount can be shared between the CCD register sections, a size of the pattern of the IC chip can also be miniaturized.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A charge transfer device comprising:
   a first input stage converting a first input signal into first signal charge;
   a first shift register transferring said first signal charge with a first delay amount;
   a second input stage converting a second input signal into second signal charge and having first switching means for selectively inputting said second signal charge to a second shift register;
   said second shift register transferring said second signal charge with a second delay amount;
   a third input stage converting a third input signal into third signal charge and having second switching means for selectively inputting said third signal charge to a third shift register;
   said third shift register transferring said third signal charge with a third delay amount; and
   adding means for selectively adding one of said second signal charge and said third signal charge to said first signal charge.

2. The charge transfer device according to claim 1, wherein said first, second and third delay amounts are D, (2H+D) and (1H+D), respectively, where D is a predetermined delay amount and H is a horizontal scanning period.

3. The charge transfer device according to claim 1, wherein said first, second and third input signals are video signals.

4. The charge transfer device according to claim 1, wherein, when said first switching means is selected and serves to input said second signal charge to said second shift register, said second switching means is not selected and serves to prevent said third signal charge from being input to said third shift register.

5. The charge transfer device according to claim 1, wherein a part of said third shift register consists of a part of said second shift register.

6. The charge transfer device according to claim 1, wherein phases of said second and third input signals are opposite to that of said first input signal.

7. A charge transfer device comprising:
   a first input stage converting a first input signal into first signal charge;
   a first shift register transferring said first signal charge with a first delay amount;
   a second input stage having a first input source and converting a second input signal into second signal charge according to a voltage of said second input signal, said first input source having a variable potential to selectively input said second signal charge to a second shift register;
   said second shift register transferring said second signal charge with a second delay amount;
   a third input stage having a second input source and converting a third input signal into third signal charge according to a voltage of said third input signal, said second input source having a variable potential to selectively input said third signal charge to a third shift register;
   said third shift register transferring said third signal charge with a third delay amount; and
   adding means for selectively adding one of said second signal charge and said third signal charge to said first signal charge.

8. The charge transfer device according to claim 7, wherein said first, second and third delay amounts are D, (2H+D) and (1H+D), respectively, where D is a predetermined delay amount and H is a horizontal scanning period.

9. The charge transfer device according to claim 7, wherein said first, second and third input signals are video signals.

10. The charge transfer device according to claim 7, wherein, when a voltage supplied to said first input source is a low level to thereby input said second signal charge to said second sift register, a voltage supplied to said second input source is a high level to thereby prevent said third signal charge from being input to said third shift register.

11. The charge transfer device according to claim 7, wherein a part of said third shift register consists of a part of said second shift register.

12. The charge transfer device according to claim 7, wherein phases of said second and third input signals are opposite to that of said first input signal.

* * * * *